United States Patent [19]

Yamaguchi et al.

[11] Patent Number: 4,845,567
[45] Date of Patent: Jul. 4, 1989

[54] IMAGE SENSOR

[75] Inventors: Kazufumi Yamaguchi, Yao; Takahiko Murata; Yasunori Yamamoto, both of Osaka, all of Japan

[73] Assignee: Matsushita Electric Industrial Co., Ltd., Osaka, Japan

[21] Appl. No.: 18,576

[22] Filed: Feb. 25, 1987

[51] Int. Cl.[4] .............................................. H04N 3/14
[52] U.S. Cl. ................................. 358/213.29; 250/578
[58] Field of Search ...................... 358/213.15, 213.29, 358/213.31, 293, 294, 212; 250/578; 357/24 LR, 30

[56]  References Cited

U.S. PATENT DOCUMENTS

| 4,011,402 | 3/1977 | Koike et al. | 358/213.31 |
| 4,109,284 | 8/1978 | Tompkins | 358/212 |
| 4,145,721 | 3/1979 | Beaudouin et al. | 358/213 |
| 4,240,116 | 12/1980 | Tomlinson, Jr. | 358/213.31 |
| 4,567,529 | 1/1986 | Yamaguchi et al. | 250/578 |
| 4,686,554 | 8/1987 | Ohmi et al. | 357/30 |

OTHER PUBLICATIONS

D. Kasperkovitz "A 20-MHz P-N-N Shift Register with Current Mirror Coupling" IEEE Journal of Solid-State Circuits, vol. SC-10, No. 3, Jun. 1975.

*Primary Examiner*—L. T. Hix
*Assistant Examiner*—David M. Gray
*Attorney, Agent, or Firm*—Wenderoth, Lind & Ponack

[57]  ABSTRACT

An self-scan type linear image sensor comprises an array of a plurality of phototransistors or photodiodes, a shift register, and current switches operating in response to parallel output signals from the shift register. The shift register is comprised of thyristors and interstage coupling transistors cascade-connecting the thyristors. The current switches are comprised of a first differential current switch executing differential switching operations between parallel output signals from odd-number stages of the shift register and a first separation signal, and a second differential current switch executing differential switching operations between parallel output signals from even-number stages of the shift register and a second separation signal. Current outputs from these current switches are delivered to collectors of the phototransistors, which are connected at emitters, common to an image signal output line.

13 Claims, 8 Drawing Sheets

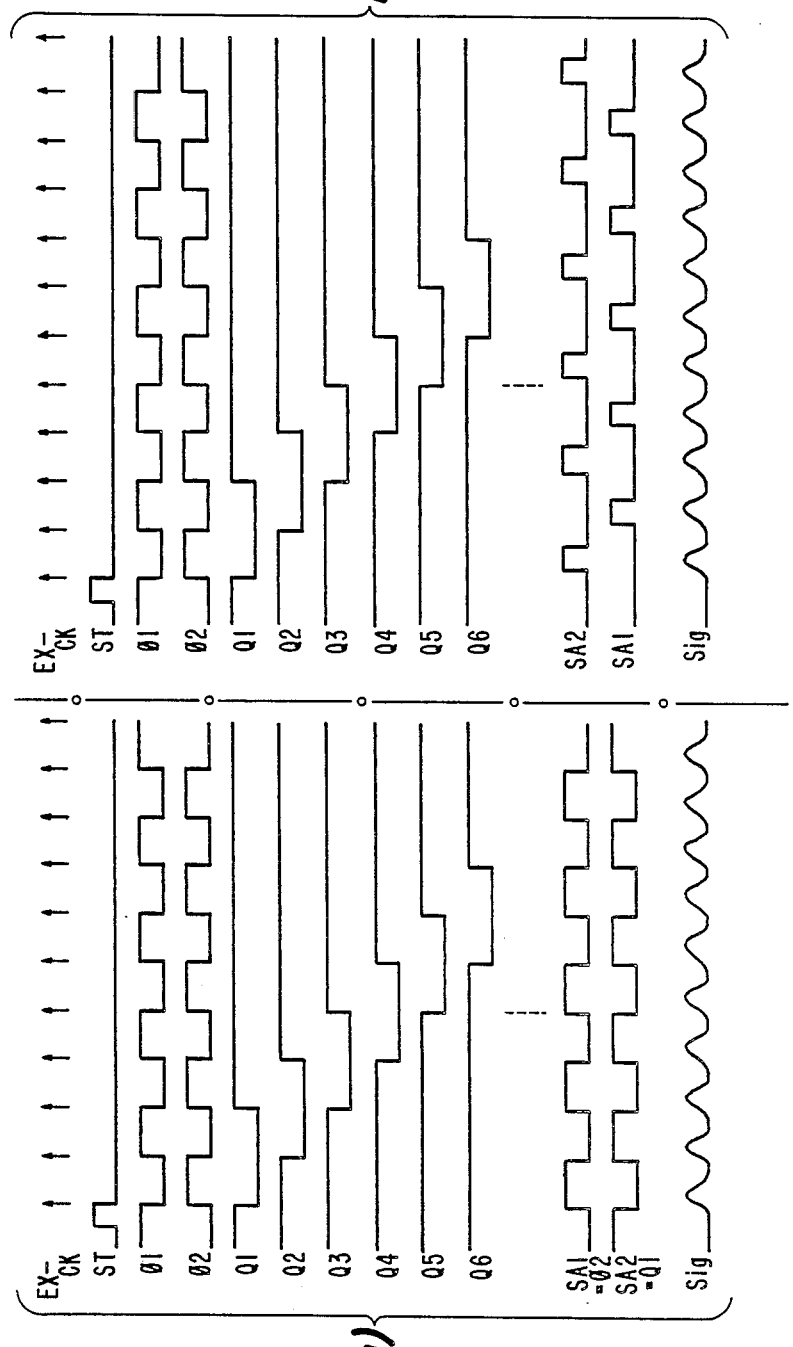

IMAGE SENSOR

BACKGROUND OF THE INVENTION

1. Field of the Invention

The present invention relates to a linear image sensor capable of optically reading an image on a document, and more particularly to a long size integrated image sensor which is capable of reading an isometric image formed on the sensor surface and used in a document-reading scanner, a facsimile, etc.

2. Description of the Prior Art

Conventionally, image sensors formed on a single-silicon crystal substrate by applying IC technology are known as CCD image sensors and MOS image sensors for example. Additionally, image sensors formed on either a glass or quartz substrate by applying thin-film technology are known as CdS-CdSe image sensors and amorphous Si image sensors, for example.

Generally, any conventional image sensor is comprised of a plurality of photosensors and a scanning circuit. The CCD (charge-coupled device) image sensor incorporates photodiodes as the photosensors and a CCD as the scanning circuit. The MOS image sensor incorporates photodiodes as the photosensors and a shift register comprised of MOS transistors as the scanning circuit. The CdS-CdSe image sensor incorporates photoconductors made from CdS-CdSe film as the photosensors and an x-y matrix circuit as the scanning circuit. The amorphous Si image sensor incorporates either photodiodes or photoconductors made from amorphous silicon as the photosensors and either a shift register or an x-y matrix circuit made from amorphous silicon as the scanning circuit.

From the view point of an image reading method, there are two types of image reading apparatus: one that reads a reduced image formed on the sensor surface; and the other that reads an isometric image of the ducument formed on the sensor surface. The reduced image reading type has already been introduced to facsimile equipment. However, it has limitations in reduction of size, resolution and sensitivity. Conversely, this type uses a sensor having a short effective sensing length , thus saving cost of the sensor itself. The isometric image reading type is compact in size due to short optical length. It also has a large photosensing area, high sensitivity, and easy adjustability of the optical system. Conversely, this type needs a sensor having a length nearly equal to the full width of the document to be read, thus eventually resulting in high sensor cost. Since the isometric image reading type has a relatively short (20 through 50 mm) optical path, the image sensor used for this type is called "contact-type image sensor".

Recently, reflecting the above advantages of the isometric image reading method, a variety of contact-type image sensors have been developed. The contact-type image sensor uses sensor elements arranged at relatively wide pitches, (e.g., 62.5 $\mu$m pitch for 16 dots/mm resolution, and 125 $\mu$m pitch for 8 dots/mm resolution). The contact-type image sensor, having the configuration mentioned above, include the types having a CCD contact-type image sensor which incorporates a plurality of CCD image sensors disposed either linearly or zigzag on a long substrate, and CdS-CdSe and amorphous image sensors which are also integrated on a long substrate. Since the CCD image sensor uses charge carriers as signal carriers which are not at thermally equilibrium, dark current increases at a high temperature range, so that the CCD image sensor cannot easily be used at high temperature range. On the other hand, when reading a reduced image, due to an extremely small size (7 through 14 $\mu$m) of the potential well of the CCD, the reduced image can be scanned at an extremely fast speed. Conversely, when reading an isometric image, a greater size (62.5 through 125 $\mu$m) of potential well is needed, thus resulting in slower image scanning speed, greater area of charge-transfer gate, increased capacity of the transfer clock signal lines, and larger AC power consumption. Using a long CCD image sensor having sensor chips being disposed zigzag on a long substrate requires rearranging the image signals after reading the document, so that, complex driver circuit and output-signal processing circuit are unavoidably needed.

On the other hand, since the CdS-CdSe image sensor utilizes a photoconductive effect of the photosensing elements, it provides a slow photoresponsive speed (at fastest 5 mS), so that it is not suited for reading an image at a high speed. Likewise, an amorphous Si image sensor utilizing the photoconductive effect of the photosensing elements is not suited for reading image at a high speed. Another amorphous Si image sensor using photodiodes for making up photosensing elements provides faster photoresponsive speeds. However, due to the insufficient sensitivity and S/N (signal-to-noise) ratio, this is also not suited for reading an image at high speed and high quality. A scanning circuit, i.e., x-y matrix circuit or shift register made from thin-film elements, is inferior to that made from Si crystal elements in operation speed and read image quality. Taking this into account, image sensors made from thin-film elements are mostly applied to low-speed and inexpensive image sensors due to its advantage for allowing integral production of long size, rather than aiming at such performances of operation speed, resolution and S/N ratio.

SUMMARY OF THE INVENTION

An object of the present invention is to provide a novel self-scanning type image sensor containing photosensor elements and a scanning circuit which are formed on a single silicon chip substrate, which is capable of optically reading image information from a document at an extremely fast speed, with high sensitivity, and by a low power voltage. In particular, the invention is to provide an ideal image sensor as a contact-type image sensor for reading an isometric image from the document.

The image sensor according to the present invention comprises: an array of photosensing elements; a shift register; means for driving odd-number elements of the photosensing elements by respective odd-stage parallel outputs of the shift register; and means for driving even-number elements of the photosensing elements by respective even-stage parallel outputs of the shift register.

A first preferred embodiment of the invention comprises: an array of phototransistors (or photodiodes); a shift resister; a plurality of current switches which operate in response to parallel output signals of the shift register; a circuit for connecting output terminals of the current switches to first terminals of the phototransistors, respectively; a first image signal output line to which second terminals of odd-number phototransistors of the array are commonly connected; and a second image signal output line to which second terminals of even-number phototransistors of the array are commonly connected.

A second preferred embodiment of the invention comprises: an array of phototransistors (or photodiodes); a shift register; first differential current switches which operate in response to parallel output signals from odd-stage terminals of the shift register; second differential current switches which operate in response to parallel output signals from even-stage terminals of the shift register; a circuit for connecting output terminals of these differential current switches to first terminals of the phototransistors, respectively; and an image signal output line to which second terminals of the phototransistors are commonly connected.

The first preferred embodiment will be described in more detail. The shift register comprises a plurality of thyristors cascade-connected by interstage-coupling transistors. The current switches are substantially comprised of PNP transistors which are connected at base electrodes to respective N-gates of the thyristors, and at emitter electrodes to respective anodes of the thyristors. Collectors of these transistors are the output terminals of the current switches, and connected to respective collectors of the phototransistors so that the phototransistors can sequentially be charged (i.e., entering into image-reading status) in accordance with respective parallel output signals from the shift register. The parallel output signals from the shift register are half-cycle shift signals. In other words, parallel output signals from each two adjacent stages super-impose themselves by 50%. However, since the first image signal output line is commonly connected to emitters of the odd-number phototransistors and the second image signal output line is commonly connected emitters of the even-number phototransistors, cross-talk of the image signals between adjoining bits can be avoided. Although cross-talk of the image signals can be generated between adjoining bits by saturation of the current switching PNP transistors, this can also be prevented by connecting clamp diodes to the collectors of the phototransistors.

The second preferred embodiment will be described in more detail. The shift register is comprised of a plurality of thyristors which are cascade-connected by interstage-coupling transistors. The first differential current switches execute differential switching operations between the respective parallel output signals from the odd-stage terminals of the shift register and a first separation signal, and the second differential current switches execute differential switching operations between the respective parallel output signals from the even-stage terminals of the shift register and a second separation signal. Basically, the first (second) differential current switches are comprised of a plurality of PNP transistors which are connected at emitters in common, at bases to respective N-gates of the odd-(even)-stage thyristors, and at collectors to respective collectors of the odd(even)-number phototransistors. Since the switching operations effectively eliminate superimposition of charge currents between adjoining bits, no cross-talk is generated in the image signal line. The first and second separation signals should be two phase signals which are not superimposed each other. Preferably, another array of phototransistors shielded from light is provided in parallel with the image reading phototransistor array so that image signals and noise-cancelling signals are obtained at the common emitter lines of the image reading phototransistor array and the light-shielded phototransistor array, respectively. Both the image and noise-canceling signals are differentially amplified by a differential amplifier to eventually improve S/N ratio.

The third preferred embodiment of the invention comprises: 3-line phototransistor arrays provided at photoreceptive windows of phototransistors with color filters; a shift register; differential current switches, a circuit allowing currents outputted from the differential current switches to be delivered to common collector electrodes of phototransistors of odd and even stages; and 3 image-signal lines connected to emitters of phototransistors of the respective 3-line arrays. Since color signals are outputted in parallel with each other, colored image can be read at a high speed. In addition, since a same color is generated by a same array, color filters can easily be formed.

The contact-type image sensor needs to have a length nearly equal to the width of the document. Since the length of the image sensor chip is limited by the size of silicon having 4 through 6 inches of diameter, the contact-type image sensor is compulsorily produced by disposing a plurality of image sensor chips on a long substrate. On the other hand, the image sensor of the invention produces the image signals as current signals. Therefore, even when the sensor unit is split into a plurality of chip parts, satisfactory image signals can be generated in series from discrete chips by commonly connecting respective image signal lines. Every stage of the shift register can be formed on the same isolated areas using a bipolar IC process. This effectively reduces the needed area and the width of an IC chip, resulting in a more inexpensive IC chip. Further, the image sensor of the invention can sufficiently be driven by applying a low power voltage (about 3V), so that it is ideally suited for use in a battery-operated apparatus.

BRIEF DESCRIPTION OF THE DRAWINGS

The invention will be better understood from the detailed description given hereinbelow and the accompanying drawings which are given by way of illustration only, and thus are not limitative of the invention in which:

FIGS. 4 (a) and 4 (b) are, respectively, signal timing charts for explaining the operation of the image sensor shown in FIG. 3;

DESCRIPTION OF THE PREFERRED EMBODIMENTS

Figure 1:
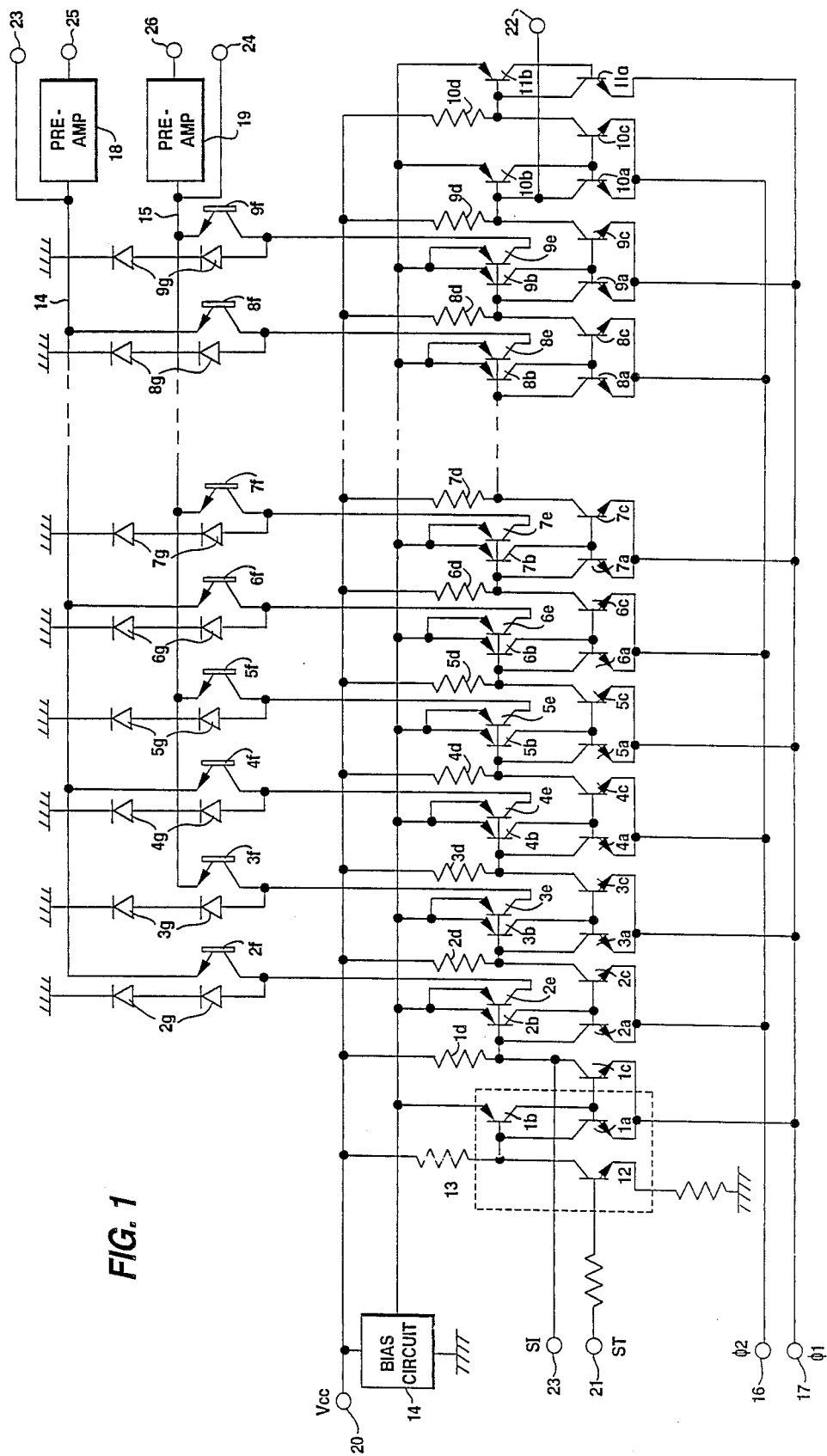
FIG. 1 is a circuit diagram showing a first embodiment of the image sensor according to the invention.

FIG. 1 is a circuit diagram showing a first embodiment of an image sensor according to the invention. Bases and collectors of NPN transistors 1a through 11a are connected to collectors and bases of PNP transistors 1b through 11b respectively so as to construct thyristors. NPN transistors 1c through 10c are interstage-coupling transistors each of which transfers an ON or OFF state of each stage thyristor to the next stage thyristor. Resistors 1d through 10d are load resistors each of which delivers an output current of each of the interstage-coupling transistors 1c through 10c to the gate of the next stage thyristor with a desired sensitivity. These thyristors, interstage-coupling transistors and load resistors construct a shift register. An input coupling transistor 12 delivers a start input signal to the gate of the initial stage thyristor, and a resistor 13 is a load resistor of the transistor 12. PNP transistors 2e through 9e respectively make up current switching transistors which operate according to ON or OFF states of the thyristors to which they are connected. Emitters and bases of the transistors 2e through 9e are connected to the corresponding emitters and bases of the PNP transistors 2b through 9b of the thyristors. The current switching transistors 2e through 9e take out parallel output current signals of the shift register. Internal bias circuit 14 delivers a desired power voltage to the emitters of the PNP transistors 1b through 11b of the thyristors (i.e., anodes of the thyristors).

Phototransistors 2f through 9f, are integrated on a silicon chip substrate at specific intervals. Collectors of the phototransistors 2f through 9f are respectively connected to collectors of the current switching transistors 2e through 9e. When a thyristor turns ON, the phototransistor coupled thereto is activated to be in a reading condition to generate a photocurrent as an image signal at an image output line 14 or 15.

The output line 14 is connected to emitters of the odd-number phototransistors 2f, 4f, 6f, ..., 8f, whereas the output line 15 is connected to emitters of the even-number phototransistors 3f, 5f, 7f, ..., 9f.

Diode arrays 2g through 9g respectively prevent the current switching transistors 2e through 9e from saturating and charge the phototransistors with a constant voltage at an extremely fast speed.

Input terminals 16 and 17 respectively receive two-phase clock pulses $\phi 1$ and $\phi 2$ used for operating the shift register. The clock pulse $\phi 1$ is delivered to the cathodes of the odd-number thyristors (i.e., emitters of the NPN transistors 1a, 3a, 5a, ..., 11a) and the clock pulse $\phi 2$ is delivered to the cathode of the even-number thyristors (i.e., emitters of the NPN transistors 2a, 4a, 6a, 10a). Preamplifiers 18 and 19 respectively amplify the image signals on the image output lines 14 and 15. Expand terminal 22 outputs a signal indicative of a current-conducted state of the thyristor connected to the final phototransistor 9f. The shift register is provided with a serial input terminal SI 23. When a long-size image sensor is formed by linearly disposing a plurality of image sensor chips, a serial image signal can easily be generated between the chips by connecting the expand terminal 22 of one chip to the SI terminal 23 of the next chip.

Operations of the first embodiment of the image sensor of the invention is described below.

The first embodiment uses an N-gate type thyristor, which is triggered by feeding a desired negative voltage compared to the anode voltage to the gate electrode (i.e., bases of the PNP transistors making up the thyristor).

Figure 2:
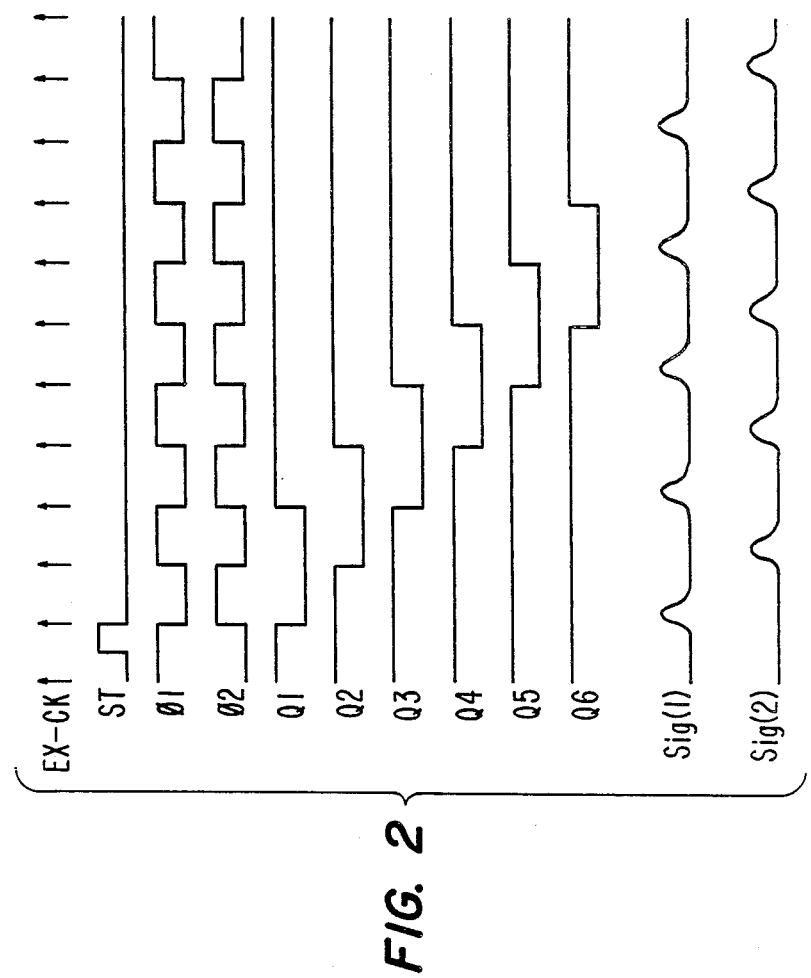
FIG. 2 is a signal timing chart for operation of the image sensor shown in FIG. 1.

FIG. 2 is a timing chart showing the operation of the image sensor of the first embodiment of the invention. Ex-Ck, delivered from a controller in an apparatus, is a time-reference pulse signal for generating pulses needed for driving the image sensor. When a "H" level pulse is received by a ST terminal 21, the gate electrode of the first-stage thyristor (base of the PNP transistor 1b) goes to an "L" level. While this state remains, if the cathode of the thyristor (i.e., emitter of the NPN transistor 1a) is "L", i.e., if the shift clock $\phi 1$ is "L", the thyristor becomes conductive, and as a result, the gate voltage Q1 of the second-stage thyristor goes "L". Even when the ST terminal goes "L", the first-stage thyristor remains conductive. Since the cathode of the second-stage thyristor still remains "H" even when the gate voltage of the second-stage thyristor is "L", the gate voltage of the third-stage thyristor also remains "H" to allow the third-stage thyristor to remain OFF, so that, no racing phenomenon occurs.

Next, when the cathode of the second-stage thyristor goes "L", gate voltages of the second and third stage thyristors also become "L". Signals Q1 through Q6 respectively denote gate voltages of the second through seventh stage thyristors. For example, the signal Q1 goes "L" when a current flows through the resistor 1d via the interstage-coupling transistor 1c while the initial-stage thyristor remains conductive, or when a part of the collector current of the NPN transistor 2a flows through the resistor 1d while the second-stage thyristor remains conductive. The state of current conduction is sequentially shifted due to the processes taking place between the thyristors including the transmission of the conductive state of one-stage thyristor to the gate electrode of the next-stage thyristor followed by the inactivation of the prior-stage thyristor simultaneous with the activation of the present-stage thyristor by the varying shift-clock signals.

The circuit of the cascade-connected thyristors mentioned above produces the normal function of the shift register. In conjunction with operations of the current switching transistors 2e through 9e extracting parallel output signals from the shift register, as shown in FIG. 4 FIG. (1) and FIG. (4), image signal current can be generated under charge storage mode. Referring to FIG. 1, due to its wire connection, all transistors surrounded by broken lines can be formed in an identical isolation area of bipolar IC. Consequently, the image sensor can be produced using an extremely narrow area, thus effectively reducing the width of the image sensor chip, securely reducing costs and improving yield.

Figure 3:
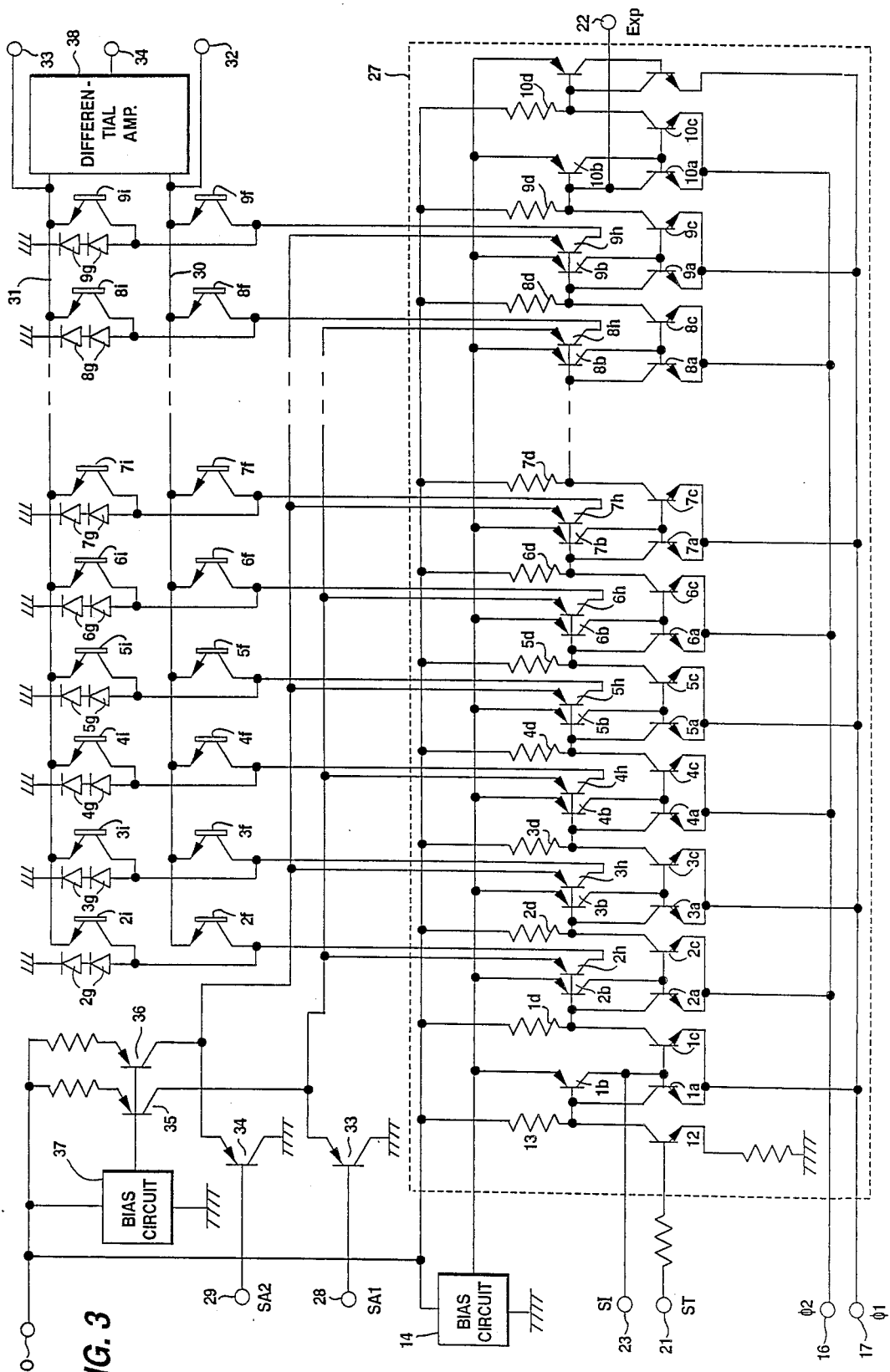
FIG. 3 is a circuit diagram showing a second embodiment of the image sensor according to the invention.

FIG. 3 is a circuit diagram of a second embodiment of the image sensor according to the invention. This embodiment also uses a shift register 27 having a constitution which is almost identical to that of the first embodiment shown in FIG. 1. However, in the second embodiment, parallel output currents are extracted from the respective stages in a manner different from that of the first embodiment. Differential current switching transistors 2h, 4h, 6h, ..., 8h operate in response to parallel output signals from the odd-number thyristors, and these transistors make up a first differential switching circuit together with a reference transistor 33. Differential current switching transistors 3h, 5h, 7h, ..., 9h operate in response to parallel output signals from the even-number thyristors, and these transistors make up a second differential switching circuit together with a reference transistor 34. PNP transistors 35 and 36 respectively make up constant current sources for the first and second differential current switches together with a bias voltage generating circuit 14.

Collectors of the photosensing phototransistor arrays 2f through 9f are respectively connected to collectors of the differential current switching transistors 2h through 9h. Phototransistors 2i through 9i make up an array of light-shielding noise-cancelling phototransistors, and collectors of these are respectively connected to the collectors of the photosensing phototransistors 2h through 9h.

Line 30 is an image signal current output line commonly connecting emitters of the photosensing phototransistors 2h through 9h. Line 31 is a noise-cancelling signal current output line commonly connecting emitters of the noise-cancelling phototransistors 2i through 9i. When a thyristor and a differential current switch connected thereto are both turned ON, a charge current flows into the corresponding photosensing and noise-cancelling phototransistors, which then enter into a image reading state to produce an image signal current and a noise-cancelling signal current at the lines 30 and 31 respectively.

Diode arrays 2g through 9g respectively prevent the differential current switching transistors from saturating so that the phototransistors can be charged with a constant voltage at an extremely fast speed. Terminals 32 and 33 are, respectively, output terminals of the image signal current and the noise-cancelling signal current, and terminal 34 is an output terminal of an image signal obtained by differentially amplifying the signal currents mentioned above by a differential amplifier 38.

Referring now to FIGS. 3, 4(a) and 4(b), the operation of the second embodiment of the image sensor according to the invention having the above constitution are described When the ST terminal 21 receives a "H" level pulse (where the "H" level duration is at most 1-clock period), the gate voltage of the first-stage thyristor (i.e., at the base of PNP transistor 1b) goes "L". While this state still remains, if the cathode of the thyristor (i.e., the emitter of the NPN transistor 1a) is "L", in other words, if the shift clock $\phi 1$ is "L", then the first-stage thyristor becomes conductive, and as a result, gate voltage Q1 of the second-stage thyristor goes "L". Then, as soon as the shift clock $\phi 2$ changes to "L", the second-stage thyristor becomes conductive, thus allowing the gate voltage Q1 of the second-stage thyristor to remain in the "L" level. The gate voltage of the first-stage thyristor goes "H" at the timing of this shift clock variation. Activation of the second-stage thyristor causes gate voltage Q2 of the third-stage thyristor to go "L". When the shift clock signal changes further, the gate voltage Q1 of the second-stage thyristor goes "H". On the other hand, since the third-stage thyristor remains conductive, the gate voltage Q2 still remains "L".

As mentioned above, the gate voltages of the respective thyristors shift in the order of Q1 through Q6 in accordance with the shift clock pulses. The gate voltages Q1 through Q6 superimpose themselves each one-half cycle. If the current switches are driven by only the gate signals Q1 through Q6, a charge current will simultaneously flow through each adjoining two phototransistors, which then appears in the image signal output line 30 to eventually cause cross-talk between adjacent bits.

The first and second differential current switches are comprised of PNP transistors, which operate so that current delivered to the common emitter can be fed back to the collector of a transistor receiving the lowest voltage at the base. Bases of the reference transistors 33 and 34 of first and second differential current switches respectively receive first and second separation signals SA1 and SA2 composed of shift clock pulses $\phi 1$ and $\phi 2$ for differentially executing switching operations between these input pulses and parallel output signals from the thyristors. The "L" level of the separation signals shown in FIG. 4(a) should be lower than the "L" level of the voltages Q1 through Q6, whereas the "H" level of the separation signal should be higher than the "L" level of the voltages Q1 through Q6. For example, current flows to the collector of the differential switching transistor 3h only when the voltage Q2 is "L" and its separation signal remains "H" and no current flows through this collector when the separation signal goes "L". This effectively prevents output currents from the differential current switches from superimposing in all timings.

As shown in FIG. 4(b) SA1 and SA2, it is also possible for the circuit to separate the superimposed charge currents of phototransistors from each other by feeding two-phase pulses of a low duty ratio with the same frequency as that of the shift clock to terminals 28 and 29, thus ensuring stable operation even when dealing with a high frequency. More specifically, the current switching transistor 2h connected to the second-stage thyristor becomes ON only when the gate voltage Q1 of the second-stage thyristor is "L" and the first separation signal SA1 is "H" so as to drive the first phototransistor 2f. The current switching transistor 3h connected to the third-stage thyristor becomes ON only when the gate voltage Q2 of the third-stage thyristor is "L" and the second separation signal SA2 is "H" so as to drive the second phototransistor 3f. Therefore, the current switching transistors 2h and 3h, for respectively driving the adjacent first and second phototransistors 2f and 3f, do not become ON at the same time. As the result, no cross-talk occurs between the image signal bits produced by the first and second phototransistors 2f and 3f. The same can be said for the following stages In this way, the odd-number phototransistors are driven by the odd-stage parallel output signals of the shift register by means of the first differential switching circuit responsive to the first separation signal, and the even-number phototransistors are driven by the even-stage parallel output signals of the shift register by means of the second differential switching circuit responsive to the second separation signal.

The circuits shown in FIGS. 1 and 3 can securely be produced on a silicon chip by applying bipolar IC technology. The circuit configurations are simple. Since the thyristor itself has the function of holding signals, current flows only through an activated (ON state) stage of the shift register, thus effectively saving power. Since the image sensor reads on one dot per moment, only one stage of the shift register may be activated. Therefore, although the image sensor is produced by bipolar IC, power consumption is extremely small.

Figure 5A:
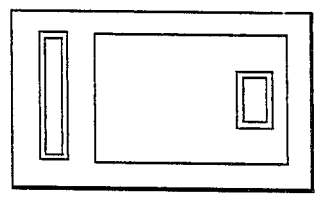
FIG. 5 shows plan and sectional views of an example of a phototransistor applicable to the image sensor of the invention.
Figure 5B:
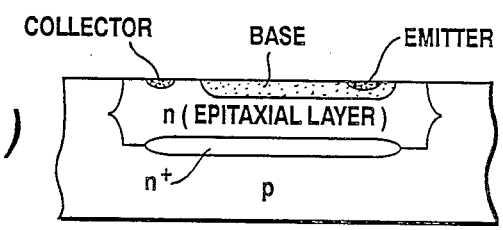

The embodiments described above use the circuit extracting image signals from the emitters of floating-base phototransistors as photosensor elements in charge storage mode by allowing accessing charge current to flow through collectors. FIG. 5, (a) and (b) respectively show plan and sectional views of such an IC-phototransistor. When reading image from the document at an extremely fast speed, charging time for the phototransistor should be short. Thus, the phototransistor should be charged at an extremely fast speed. If the document image is sequentially accessed by the image sensor under slow charging speed and incompletely charged condition, residual image unavoidably grows, thus degrading the image-reading quality. When feeding charge current to the collector of the phototransistor shown in FIG. 5, since the capacitance between the collector and the substrate is relatively large, the phototransistor is charged at a slow speed.

Figure 6A:
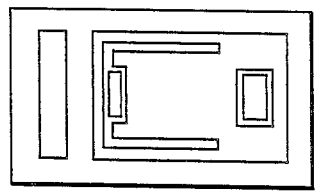
FIG. 6 shows plan and sectional views of another example of a phototransistor applicable to the image sensor of the invention.
Figure 6B:
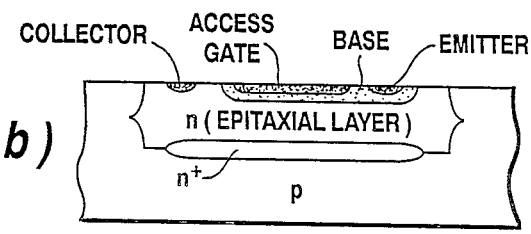

FIG. 6, (a) and (b) respectively show plan and sectional views of a phototransistor chargeable at an extremely fast speed. This transistor is provided with an additional emitter as an access gate in addition to the base, emitter and collector. This phototransistor is floated at the base, and connected at the collector to a power supply (Vcc) and at the emitter to the image output line. An image signal can be extracted in the charge storage mode from the emitter by flowing a charging current into the access gate Since the access gate has extremely small capacitance, an extremely fast charging is possible, and a high quality image can be achieved even when scanning the image at an extremely fast speed.

Figure 7:
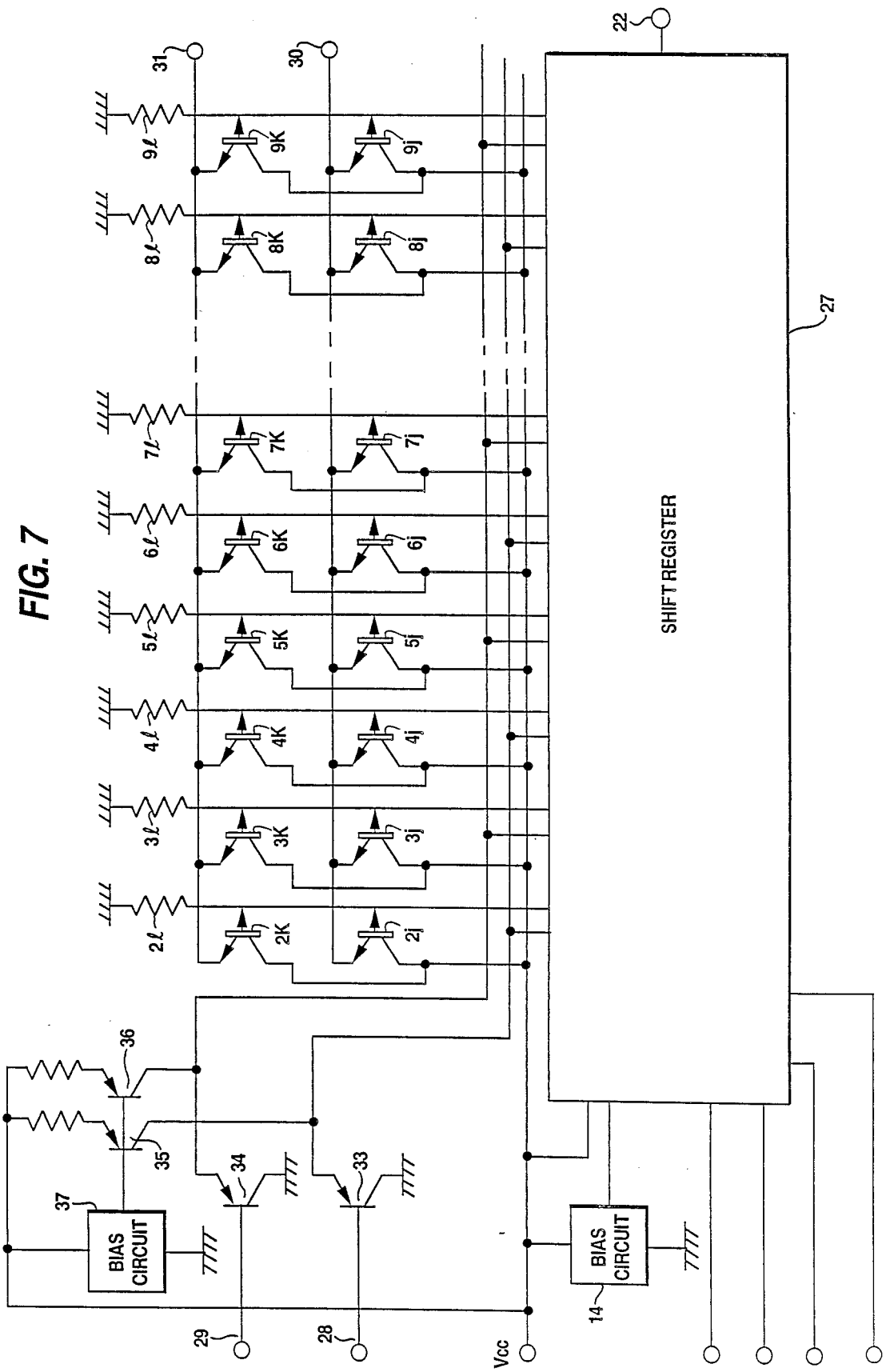
FIG. 7 is a circuit diagram showing a third embodiment of the image sensor according to the invention.

FIG. 7 is a circuit diagram of a third embodiment of the image sensor according to the invention, in which the floating base phototransistors with access gates as shown in FIG. 6 are used for the photosensing elements. Although this system uses the scanning circuit which is identical to that shown in FIG. 3, respective outputs from the differential current switches are delivered to the access gates of the phototransistors. Collectors of the photosensing phototransistors $2j$ through $9j$ are connected in common to the power voltage source Vcc. An image signal output line 30 is connected to the emitters of these photosensing phototransistors. Light-shielded noise-cancelling phototransistors $2k$ through $9k$ respectively have their collectors commonly connected to the power voltage source Vcc, and emitters commonly connected to to a noise-cancelling signal output line 31. Resistors 21 through 91 are load resistors for the differential current switches, and the resistance values thereof is properly chosen so that the charge voltage applied to the phototransistors are set at a desired level.

Figure 8:
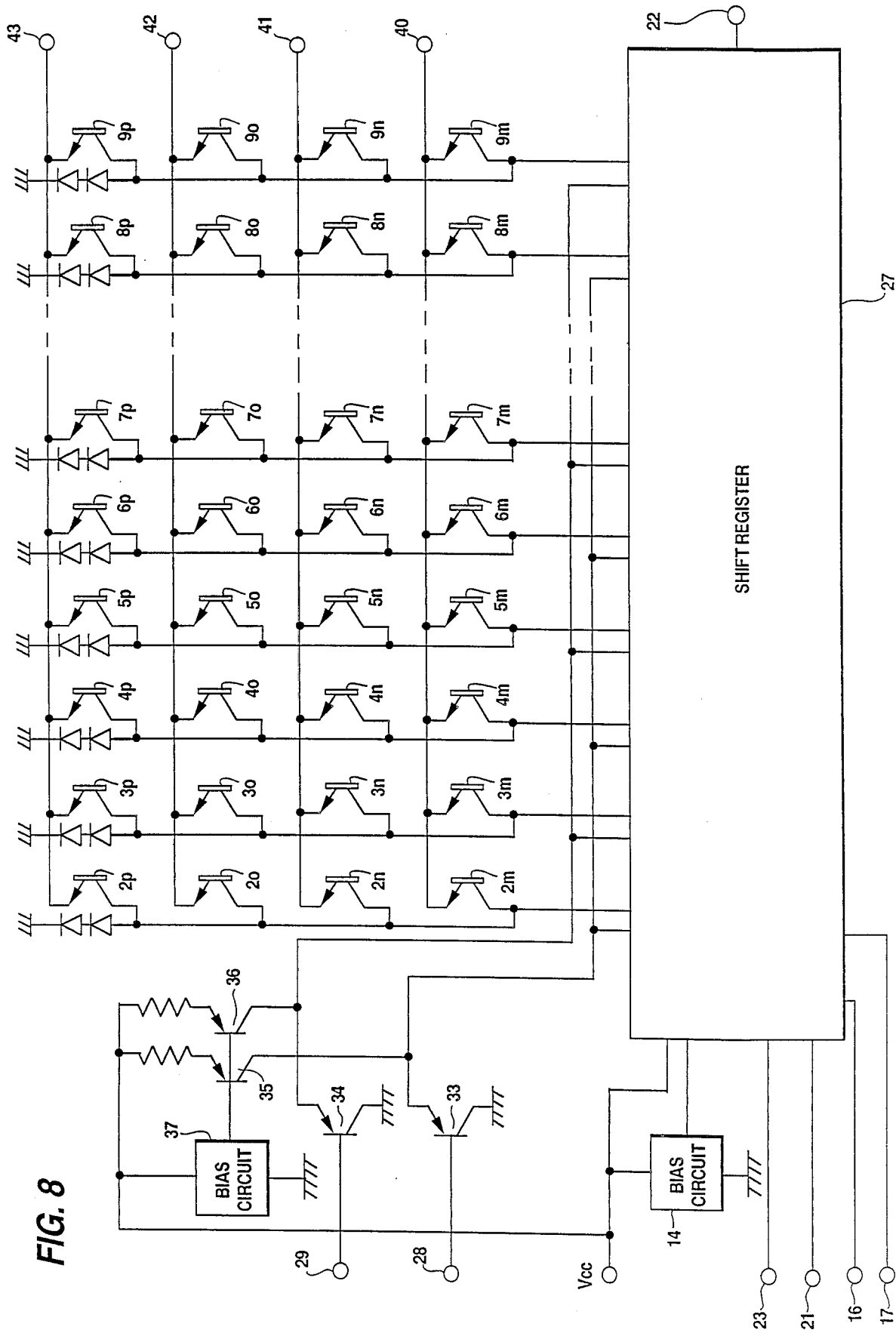
FIG. 8 is a circuit diagram showing a fourth embodiment of a color image sensor according to the invention.

FIG. 8 is a circuit diagram of a fourth embodiment of image the sensor according to the invention. The fourth embodiment is a color image sensor, in which the photosensing part is comprised of 3-lines of phototransistor arrays: $2m$ through $9m$; $2n$ through $9n$; and $2o$ through $9o$. It is also provided with an array of light-shielded noise-cancelling phototransistors $2p$ through $9p$. Each photoreceptive area of each phototransistor array is provided with a color filter of either red, green and blue, or yellow, green and magenta, for example.

A first phototransistor array image signal output line 40 outputs a first color image signal current, like red, for example. A second phototransistor array image signal output line 41 outputs a second color image signal current, like green, for example. A third phototransistor array image signal output line 42 outputs a third color image signal current, like blue, for example A fourth phototransistor image signal output line outputs a noise-cancelling signal current. A first color image signal having an extremely high S/N ratio without a noise component can be generated by differentially amplifying the signal current output from the lines 40 and 43. Likewise, second and third color image signals having an extremely high S/N ratio can be generated by differentially amplifying the signal current outputs from the lines 41 and 43 and from the lines 42 and 43.

The above-described four embodiments use phototransistors as the photosensing elements The invention is not limited to using only the phototransistors, but any photoelectric conversion element generating current proportional to received light, like photodiodes, for example, can also be used.

Figure 9:
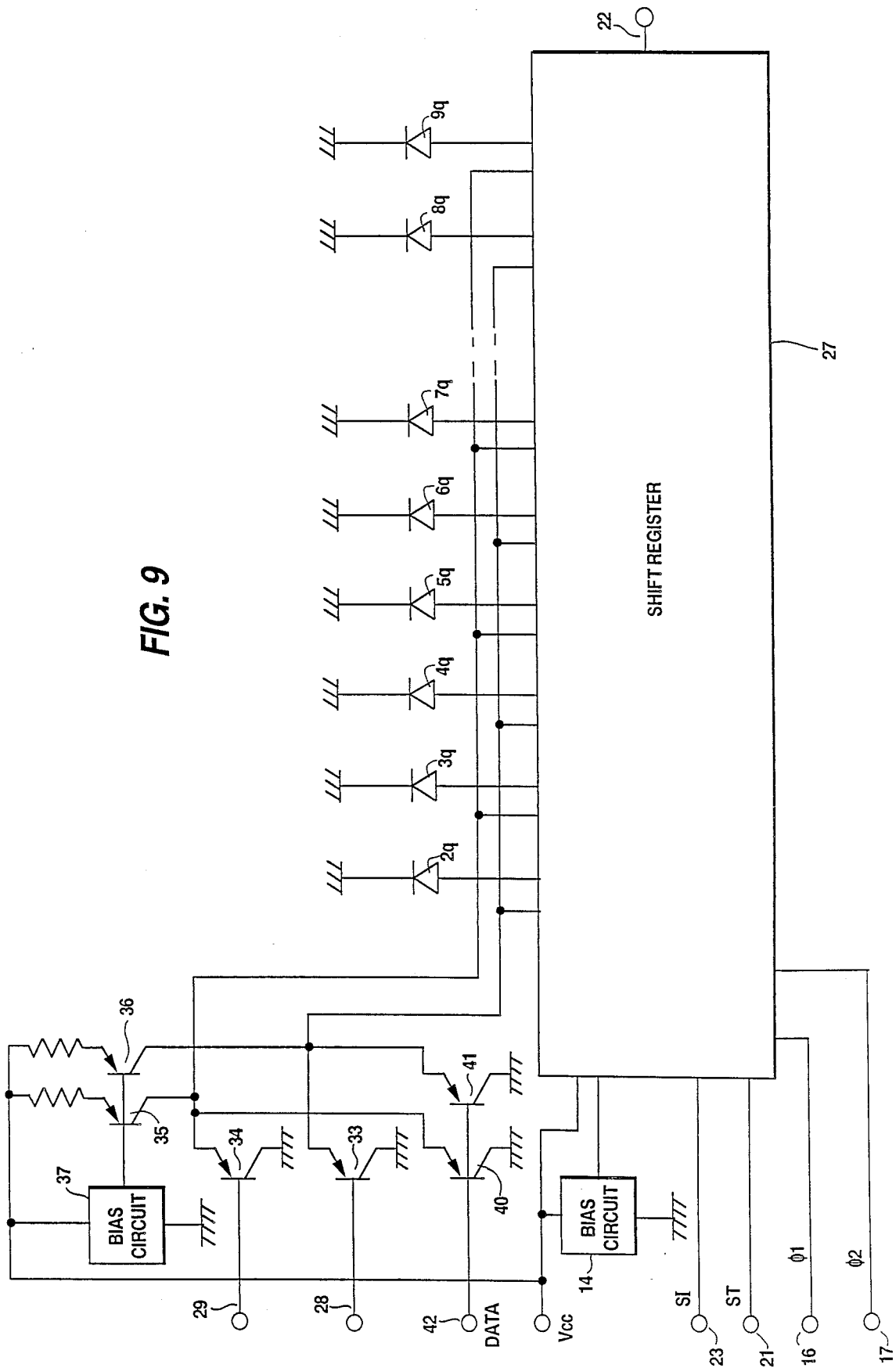
FIG. 9 is a circuit diagram of a LED array drive circuit as still another embodiment of the invention.

FIG. 9 is a circuit diagram showing a LED (light emitting diode) array drive circuit. This circuit is comprised of a shift register 27 identical to that shown in FIG. 3, first and second differential current switches identical to those shown in FIG. 3, a reference transistor 33 for the first differential currents switch, a reference transistor 34 for the second differential current switch, constant current supply sources 35 and 36 generating constant currents for delivery to the current switches, transistors 40 and 41 whose output levels are controllable in response to an input data, and an array of LEDs $2q$ through $9q$. When a data input terminal 42 receives a serial external data synchronous with the sift clock pulses, the LEDs sequentially light on or off in conjunction with output currents from the differential current switches and in response to the input data to allow a specific light pattern corresponding to the input data to be generated on a photosensitive drum (not shown). Light volume of the LEDs can be controlled by analogue means by properly controlling the duty ratios of both the first and second separation pulses delivered to terminals 28 and 29. Thus, it is possible to constantly print high quality pictures and characters. In this manner, the drive circuit applied to the image sensor of the invention can effectively be applied not only to the image sensor, but also to a variety of element arrays as well.

What is claimed is:
1. An image sensor comprising:
an array of a plurality of photosensing elements;
a plurality of thyristors which are cascade-connected by interstage coupling transistors to constitute a shift register;
a plurality of first current switches driven by parallel output signals from odd-number stages of said shift register;
a plurality of second current switches driven by parallel output signals from even-number stages of said shift register;
a first circuit for connecting output terminals of said first current switches to odd-number photosensing elements;
a second circuit for connecting output terminals of said second current switches to even-number photosensing elements;
a first image signal output line coupled to said odd-number photosensing elements; and
a second image signal output line coupled to said even-number photosensing elements.

2. The image sensor in accordance with claim 1, in which said photosensing elements are photodiodes.

3. The image sensor in accordance with claim 1, in which said photosensing elements are floating-base type phototransistors having first and second emitters respectively.

4. The image sensor in accordance with claim 3, wherein said first emitters of odd-number phototransistors are respectively connected to output terminals of said first current switches, said first emitters of even-number phototransistors being respectively connected to output terminals of said second current switches, said second emitters of said odd-number phototransistors being commonly connected to said first image signal output line, said second emitters of said even-number phototransistors being commonly connected to said second image signal output line.

5. An image sensor comprising:
an array of a plurality of photosensing elements;
a shift register;
a plurality of first differential current switches executing differential switching operations between parallel output signals from odd-number stages of said shift register and a first separation signal;
a plurality of second differential current switches executing differential switching operations between parallel output signals from even-number stages of said shift register and a second separation signal;
a circuit connecting output terminals of said first and second differential current switches to first terminals of said photosensing elements; and
an image signal output line commonly connecting second terminals of said photosensing elements 6. The image sensor in accordance with claim 5, wherein said shift register comprises a plurality of thyristors which are cascade-connected by interstage-coupling transistors.

7. The image sensor in accordance with claim 6, in which said first differential current switches are substantially comprised of a plurality of PNP transistors connected at their bases to N-gates of odd-number thyristors and a first reference transistor, and said second differential current switches are substantially comprised of a plurality of PNP transistors connected at their bases to N-gates of even-number thyristors and second reference transistor.

8. The image sensor in accordance with claim 7, further comprising: an array of light-shielded photosensing elements provided in parallel with said array of photosensing elements for producing noise-cancelling signals on a noise-cancelling signal line connected in common thereto, and means for differentially amplifying an image signal on said image signal output line and said noise-cancelling signal.

9. The image sensor in accordance with claim 5, in which said first and second separation signals are substantially two-phase pulses synchronous with shift clock pulses having a maximum of 50% of duty ratio.

10. The image sensor in accordance with claim 5, in which said photosensing elements are floating-base type phototransistors.

11. The image sensor in accordance with claim 5, in which photosensing elements are photodiodes.

12. The image sensor in accordance with claim 5, in which said photosensing elements are comprised of floating-base type phototransistors having first and second emitters, respectively, said first emitters of said phototransistors being respectively connected to output terminals of said differential current switches, collectors of said phototransistors being connected to a positive power-supply source, said second emitters of said phototransistors being commonly connected to said image signal output line.

13. The image sensor in accordance with claim 12, in which said floating-base type phototransistors are formed in identical isolation areas by bipolar IC process

* * * * *